United States Patent
Lin

(10) Patent No.: US 7,397,135 B2
(45) Date of Patent: Jul. 8, 2008

(54) TOP LAYERS OF METAL FOR HIGH PERFORMANCE IC'S

(76) Inventor: Mou-Shiung Lin, 28 Ginshan 10th Street, Hsin-Chu (TW)

( * ) Notice: Subject to any disclaimer, the term of this patent is extended or adjusted under 35 U.S.C. 154(b) by 0 days.

(21) Appl. No.: 11/839,559

(22) Filed: Aug. 16, 2007

(65) Prior Publication Data

US 2007/0273039 A1   Nov. 29, 2007

Related U.S. Application Data

(60) Continuation of application No. 11/230,102, filed on Sep. 19, 2005, now Pat. No. 7,368,376, which is a continuation of application No. 11/121,477, filed on May 4, 2005, now Pat. No. 7,294,870, which is a continuation of application No. 10/389,543, filed on Mar. 14, 2003, now Pat. No. 6,965,165, which is a division of application No. 09/972,639, filed on Oct. 9, 2001, now Pat. No. 6,657,310, which is a division of application No. 09/251,183, filed on Feb. 17, 1999, now Pat. No. 6,383,916, which is a continuation-in-part of application No. 09/216,791, filed on Dec. 21, 1998, now abandoned.

(51) Int. Cl.
   *H01L 23/29* (2006.01)
(52) U.S. Cl. .................. 257/778; 257/691; 257/692; 257/758; 257/759; 257/760
(58) Field of Classification Search ............ 257/778, 257/691, 692, 758, 759, 760
   See application file for complete search history.

(56) References Cited

U.S. PATENT DOCUMENTS

| | | | |
|---|---|---|---|
| 3,823,349 A | 7/1974 | Dhaka et al. | |
| 4,152,195 A | 5/1979 | Bahrle et al. | |
| 4,188,636 A | 2/1980 | Sato et al. | |
| 4,242,336 A | 12/1980 | Hasegawa et al. | |
| 4,423,547 A | 1/1984 | Farrar et al. | |
| 4,618,878 A | 10/1986 | Aoyama et al. | |
| 4,723,197 A | 2/1988 | Takiar et al. | |
| 4,830,974 A | 5/1989 | Chang et al. | |
| 4,881,144 A | 11/1989 | Yuito et al. | |
| 4,978,419 A | 12/1990 | Nanda et al. | |
| 4,980,034 A | 12/1990 | Volfson et al. | |
| 5,016,461 A | 5/1991 | Walker et al. | |

(Continued)

FOREIGN PATENT DOCUMENTS

JP      01-135043      5/1989

(Continued)

OTHER PUBLICATIONS

Stanley Wolf, Silicon Processing for the VLSI Era vol. 2: Process Integration, Lattice Press, Sunset Beach, CA, pp. 214-285,Copyright 1990.

(Continued)

*Primary Examiner*—Long Pham

(57) ABSTRACT

A method of closely interconnecting integrated circuits contained within a semiconductor wafer to electrical circuits surrounding the semiconductor wafer. Electrical interconnects are held to a minimum in length by making efficient use of polyimide or polymer as an inter-metal dielectric thus enabling the integration of very small integrated circuits within a larger circuit environment at a minimum cost in electrical circuit performance.

24 Claims, 9 Drawing Sheets

U.S. PATENT DOCUMENTS

| | | | |
|---|---|---|---|
| 5,055,907 A | 10/1991 | Jacobs | |
| 5,083,187 A | 1/1992 | Lamson et al. | |
| 5,106,461 A | 4/1992 | Volfson et al. | |
| 5,130,457 A | 7/1992 | Sanders et al. | |
| 5,194,928 A | 3/1993 | Cronin et al. | |
| 5,212,403 A | 5/1993 | Nakanishi et al. | |
| 5,262,353 A | 11/1993 | Sun et al. | |
| 5,338,696 A | 8/1994 | Ilderem et al. | |
| 5,360,524 A | 11/1994 | Hendel et al. | |
| 5,384,488 A | 1/1995 | Golshan et al. | |
| 5,436,412 A | 7/1995 | Ahmad et al. | |
| 5,468,984 A | 11/1995 | Efland et al. | |
| 5,489,303 A | 2/1996 | Sasaki et al. | |
| 5,501,006 A | 3/1996 | Gehman, Jr. et al. | |
| 5,514,006 A | 5/1996 | Getselis et al. | |
| 5,559,055 A | 9/1996 | Chang et al. | |
| 5,563,086 A | 10/1996 | Bertin et al. | |
| 5,635,767 A | 6/1997 | Wenzel et al. | |
| 5,659,201 A | 8/1997 | Wollesen | |
| 5,665,639 A | 9/1997 | Seppala et al. | |
| 5,686,560 A | 11/1997 | Lee | |
| 5,686,764 A | 11/1997 | Fulcher | |
| 5,719,448 A | 2/1998 | Ichikawa | |
| 5,726,499 A | 3/1998 | Irinoda | |
| 5,739,560 A | 4/1998 | Toyoda et al. | |
| 5,742,075 A | 4/1998 | Burns et al. | |
| 5,760,429 A | 6/1998 | Yano et al. | |
| 5,763,954 A | 6/1998 | Hyakutake | |
| 5,767,010 A | 6/1998 | Mis et al. | |
| 5,767,546 A | 6/1998 | Williams et al. | |
| 5,773,888 A | 6/1998 | Hosomi et al. | |
| 5,783,483 A | 7/1998 | Gardner | |
| 5,789,303 A | 8/1998 | Leung et al. | |
| 5,818,110 A | 10/1998 | Cronin | |
| 5,827,776 A | 10/1998 | Bandyopadhyay et al. | |
| 5,827,778 A | 10/1998 | Yamada | |
| 5,834,844 A | 11/1998 | Akagawa et al. | |
| 5,861,328 A | 1/1999 | Tehrani et al. | |
| 5,861,675 A | 1/1999 | Sasaki et al. | |
| 5,874,779 A | 2/1999 | Matsuno | |
| 5,894,170 A | 4/1999 | Ishikawa | |
| 5,900,668 A | 5/1999 | Wollesen | |
| 5,910,020 A | 6/1999 | Yamada | |
| 5,924,005 A | 7/1999 | Waldo | |
| 5,934,844 A | 8/1999 | Woolley | |
| 5,939,790 A | 8/1999 | Gregoire et al. | |
| 5,944,537 A | 8/1999 | Smith et al. | |
| 5,953,626 A | 9/1999 | Hause et al. | |
| 5,959,424 A | 9/1999 | Elkmann et al. | |
| 5,963,840 A | 10/1999 | Xia et al. | |
| 5,965,903 A | 10/1999 | Chittipeddi et al. | |
| 5,969,424 A | 10/1999 | Matsuki et al. | |
| 5,986,764 A | 11/1999 | Nonaka | |
| 5,989,991 A | 11/1999 | Lien | |
| 6,001,538 A | 12/1999 | Chen et al. | |
| 6,001,673 A | 12/1999 | Marcinkiewicz | |
| 6,016,000 A | 1/2000 | Moslehi | |
| 6,020,640 A | 2/2000 | Efland et al. | |
| 6,025,275 A | 2/2000 | Efland et al. | |
| 6,025,639 A | 2/2000 | Mitwalsky et al. | |
| 6,031,257 A | 2/2000 | Noto et al. | |
| 6,033,939 A | 3/2000 | Agarwala et al. | |
| 6,046,502 A | 4/2000 | Matsuno et al. | |
| 6,046,503 A | 4/2000 | Weigand et al. | |
| 6,087,250 A | 7/2000 | Hyakutake | |
| 6,100,548 A | 8/2000 | Nguyen et al. | |
| 6,103,552 A | 8/2000 | Lin | |
| 6,107,674 A | 8/2000 | Zommer | |
| 6,124,198 A | 9/2000 | Moslehi | |
| 6,124,912 A | 9/2000 | Moore | |
| 6,130,457 A | 10/2000 | Yu et al. | |
| 6,130,481 A | 10/2000 | Harada et al. | |
| 6,133,582 A | 10/2000 | Osann, Jr. et al. | |
| 6,137,155 A | 10/2000 | Seshan et al. | |
| 6,144,100 A | 11/2000 | Shen et al. | |
| 6,146,985 A | 11/2000 | Wollesen | |
| 6,150,725 A | 11/2000 | Misawa et al. | |
| 6,150,726 A | 11/2000 | Feilchenfeld et al. | |
| 6,160,297 A | 12/2000 | Shimizu et al. | |
| 6,169,019 B1 | 1/2001 | Takagi | |
| 6,174,393 B1 | 1/2001 | Scheifele | |
| 6,175,156 B1 | 1/2001 | Mametani et al. | |
| 6,184,138 B1 | 2/2001 | Ho et al. | |
| 6,184,143 B1 | 2/2001 | Ohashi et al. | |
| 6,187,680 B1 | 2/2001 | Costrini et al. | |
| 6,207,486 B1 | 3/2001 | Nishiyama | |
| 6,218,223 B1 | 4/2001 | Ikeda et al. | |
| 6,218,318 B1 | 4/2001 | Ohkura et al. | |
| 6,229,221 B1 | 5/2001 | Kloen et al. | |
| 6,261,944 B1 | 7/2001 | Mehta et al. | |
| 6,272,736 B1 | 8/2001 | Lee | |
| 6,278,174 B1 | 8/2001 | Havemann et al. | |
| 6,288,442 B1 | 9/2001 | Farrar | |
| 6,294,451 B1 | 9/2001 | Yoshizawa | |
| 6,300,234 B1 | 10/2001 | Flynn et al. | |
| 6,303,423 B1 | 10/2001 | Lin | |
| 6,303,977 B1 | 10/2001 | Schroen et al. | |
| 6,324,048 B1 | 11/2001 | Liu | |
| 6,326,673 B1 | 12/2001 | Liou | |
| 6,335,104 B1 | 1/2002 | Sambucetti et al. | |
| 6,346,471 B1 | 2/2002 | Okushima | |
| 6,348,733 B1 | 2/2002 | Lin | |
| 6,350,705 B1 | 2/2002 | Lin | |
| 6,359,328 B1 | 3/2002 | Dubin | |
| 6,370,768 B1 | 4/2002 | Itabashi | |
| 6,376,374 B1 | 4/2002 | Stevens | |
| 6,383,916 B1 | 5/2002 | Lin | |
| 6,392,300 B1 | 5/2002 | Koike | |
| 6,417,575 B2 | 7/2002 | Harada et al. | |
| 6,436,814 B1 | 8/2002 | Horak et al. | |
| 6,441,487 B2 | 8/2002 | Elenius et al. | |
| 6,455,880 B1 | 9/2002 | Ono et al. | |
| 6,455,885 B1 | 9/2002 | Lin | |
| 6,459,135 B1 | 10/2002 | Basteres et al. | |
| 6,472,745 B1 | 10/2002 | Iizuka | |
| 6,489,647 B1 | 12/2002 | Lin | |
| 6,495,442 B1 | 12/2002 | Lin et al. | |
| 6,518,092 B2 | 2/2003 | Kikuchi | |
| 6,538,326 B2 | 3/2003 | Shimizu et al. | |
| 6,544,880 B1 | 4/2003 | Akram | |
| 6,555,459 B1 | 4/2003 | Tokushige et al. | |
| 6,583,043 B2 | 6/2003 | Shroff et al. | |
| 6,593,649 B1 | 7/2003 | Lin et al. | |
| 6,605,524 B1 | 8/2003 | Fan et al. | |
| 6,605,549 B2 | 8/2003 | Leu et al. | |
| 6,614,091 B1 | 9/2003 | Downey et al. | |
| 6,614,099 B2 | 9/2003 | Farrar | |
| 6,620,728 B2 | 9/2003 | Lin | |
| 6,649,509 B1 | 11/2003 | Lin et al. | |
| 6,657,310 B2 | 12/2003 | Lin | |
| 6,673,704 B2 | 1/2004 | Wada et al. | |
| 6,707,159 B1 | 3/2004 | Kumamoto et al. | |
| 6,709,973 B1 | 3/2004 | Sakamoto | |
| 6,710,460 B2 | 3/2004 | Morozumi | |
| 6,713,381 B2 | 3/2004 | Barr et al. | |
| 6,717,159 B2 | 4/2004 | Novak | |
| 6,720,212 B2 | 4/2004 | Robl et al. | |
| 6,756,295 B2 | 6/2004 | Lin et al. | |
| 6,762,115 B2 | 7/2004 | Lin et al. | |
| 6,798,073 B2 | 9/2004 | Lin et al. | |
| 6,800,555 B2 | 10/2004 | Test et al. | |
| 6,818,540 B2 | 11/2004 | Saran et al. | |
| 6,818,546 B2 | 11/2004 | Saito et al. | |
| 6,838,769 B1 | 1/2005 | Chittipeddi et al. | |

| | | |
|---|---|---|
| 6,864,562 B1 | 3/2005 | Toyosawa et al. |
| 6,900,545 B1 | 5/2005 | Sebesta et al. |
| 6,965,165 B2 | 11/2005 | Lin |
| 6,984,891 B2 | 1/2006 | Ahn et al. |
| 7,091,616 B2 | 8/2006 | Suminoe et al. |
| 2001/0035452 A1 | 11/2001 | Test et al. |
| 2002/0017730 A1 | 2/2002 | Tahara et al. |
| 2002/0024142 A1 | 2/2002 | Sekiguchi |
| 2002/0158334 A1 | 10/2002 | Vu et al. |
| 2003/0102551 A1 | 6/2003 | Kikuchi |
| 2005/0260849 A1 | 11/2005 | Lin |
| 2005/0266612 A1 | 12/2005 | Lin |

FOREIGN PATENT DOCUMENTS

| | | |
|---|---|---|
| JP | 01-183836 | 7/1989 |
| JP | 01-184848 | 7/1989 |
| JP | 01-184849 | 7/1989 |
| JP | 04-316351 | 11/1992 |

OTHER PUBLICATIONS

Stanley Wolf, Silicon Processing for the VLSI Era vol. 2: Process Integration, Lattice Press, Sunset Beach, CA, USA copyright 1990, pp. 214-217, 282-285.

TOP LAYERS OF METAL FOR HIGH PERFORMANCE IC'S

This application is a continuation of application Ser. No. 11/230,102, filed on Sep. 19, 2005, now U.S. Pat. No. 7,368, 376, which is a continuation of application Ser. No. 11/121, 477, filed on May 4, 2005, now U.S. Pat. No. 7,294,870, which is a continuation of application Ser. No. 10/389,543, filed on Mar. 14, 2003, now U.S. Pat. No. 6,965,165, which is a division of application Ser. No. 09/972,639, filed on Oct. 9, 2001, now U.S. Pat. No. 6,657,310, which is a division of application Ser. No. 09/251,183, filed on Feb. 17, 1999, now U.S. Pat. No. 6,383,916, which is a continuation-in-part of application Ser. No. 09/216,791, filed on Dec. 21, 1998, now abandoned.

BACKGROUND OF THE INVENTION (1) Field of the Invention

The invention relates to the manufacturing of high performance Integrated Circuit (IC's), and more specifically to methods of achieving high performance of the Integrated Circuits by reducing the parasitic capacitance and resistance of inter-connecting wiring on a chip.

(2) Description of the Prior Art

When the geometric dimensions of the Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on the circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, the approach has been taken to develop low resistance metal (such as copper) for the wires while low dielectric materials are used in between signal lines. Increased Input-Output (IO) combined with increased demands for high performance IC's has led to the development of Flip Chip Packages. Flip-chip technology fabricates bumps (typically Pb/Sn solders) on Al pads on chip and interconnect the bumps directly to the package media, which are usually ceramic or plastic based. The flip-chip is bonded face down to the package medium through the shortest path. These technologies can be applied not only to single-chip packaging, but also to higher or integrated levels of packaging in which the packages are larger and to more sophisticated substrates that accommodate several chips to form larger functional units.

The flip-chip technique, using an area array, has the advantage of achieving the highest density of interconnection to the device and a very low inductance interconnection to the package. However, pre-testability, post-bonding visual inspection, and TCE (Temperature Coefficient of Expansion) matching to avoid solder bump fatigue are still challenges. In mounting several packages together, such as surface mounting a ceramic package to a plastic board, the TCE mismatch can cause a large thermal stress on the solder-lead joints that can lead to joint breakage caused by solder fatigue from temperature cycling operations.

U.S. Pat. No. 5,212,403 (Nakanishi) shows a method of forming wiring connections both inside and outside (in a wiring substrate over the chip) for a logic circuit depending on the length of the wire connections.

U.S. Pat. No. 5,501,006 (Gehman, Jr. et al.) shows a structure with an insulating layer between the integrated circuit (IC) and the wiring substrate. A distribution lead connects the bonding pads of the IC to the bonding pads of the substrate.

U.S. Pat. No. 5,055,907 (Jacobs) discloses an extended integration semiconductor structure that allows manufacturers to integrate circuitry beyond the chip boundaries by forming a thin film multi-layer wiring decal on the support substrate and over the chip. However, this reference differs from the invention.

U.S. Pat. No. 5,106,461 (Volfson et al.) teaches a multi layer interconnect structure of alternating polyimide (dielectric) and metal layers over an IC in a TAB structure.

U.S. Pat. No. 5,635,767 (Wenzel et al.) teaches a method for reducing RC delay by a PBGA that separates multiple metal layers.

U.S. Pat. No. 5,686,764 (Fulcher) shows a flip chip substrate that reduces RC delay by separating the power and 1/0 traces.

SUMMARY OF THE INVENTION

It is the primary objective of the present invention to improve the performance of High Performance Integrated Circuits.

Another objective of the present invention is to reduce resistive voltage drop of the power supply lines that connect the IC to surrounding circuitry or circuit components.

Another objective of the present invention is to reduce the RC delay constant of the signal paths of high performance IC's.

Yet another objective of the present invention is to facilitate the application of IC's of reduced size and increased circuit density.

Yet another objective of the present invention is to further facilitate and enhance the application of low resistor conductor metals.

Yet another objective of the present invention is to allow for increased I/O pin count for the use of high performance IC's.

Yet another objective of the present invention is to simplify chip assembly by reducing the need for re-distribution of I/O chip connections.

Yet another objective of the present invention is to facilitate the connection of high-performance IC's to power buses.

Yet another objective of the present invention is to facilitate the connection of high-performance IC's to clock distribution networks.

Yet another objective of the present invention is to reduce IC manufacturing costs by allowing or facilitating the use of less expensive process equipment and by accommodating less strict application of clean room requirements, this as compared to sub-micron manufacturing requirements.

Yet another objective of the present invention is to be a driving force and stimulus for future system-on-chip designs since the present invention allows ready and cost effective interconnection between functional circuits that are positioned at relatively large distances from each other on the chip.

Yet another objective of the present design is to form the basis for a computer based routing tool that automatically routes interconnections that exceed a pre-determined length in accordance with the type of interconnection that needs to be established.

The present invention adds one or more thick layers of dielectric and one or more layers of wide metal lines on top of the finished device wafer. The thick layer of dielectric can, for example, be of polyimide or benzocyclobutene (BCB) with a thickness of over, for example, 3 um. The wide metal lines can, for instance, be of aluminum or electroplated copper. These layers of dielectric and metal lines can be used for power buses or power planes, clock distribution networks, critical signal, re-distribution of I/O pads for flip chip applications, and for long signal paths.

DETAILED DESCRIPTION OF THE INVENTION

The present invention teaches an Integrated Circuit structure where key re-distribution and interconnection metal layers and dielectric layers are added over a conventional IC. These re-distribution and interconnection layers allow for wider buses and reduce conventional RC delay.

Figure 1:
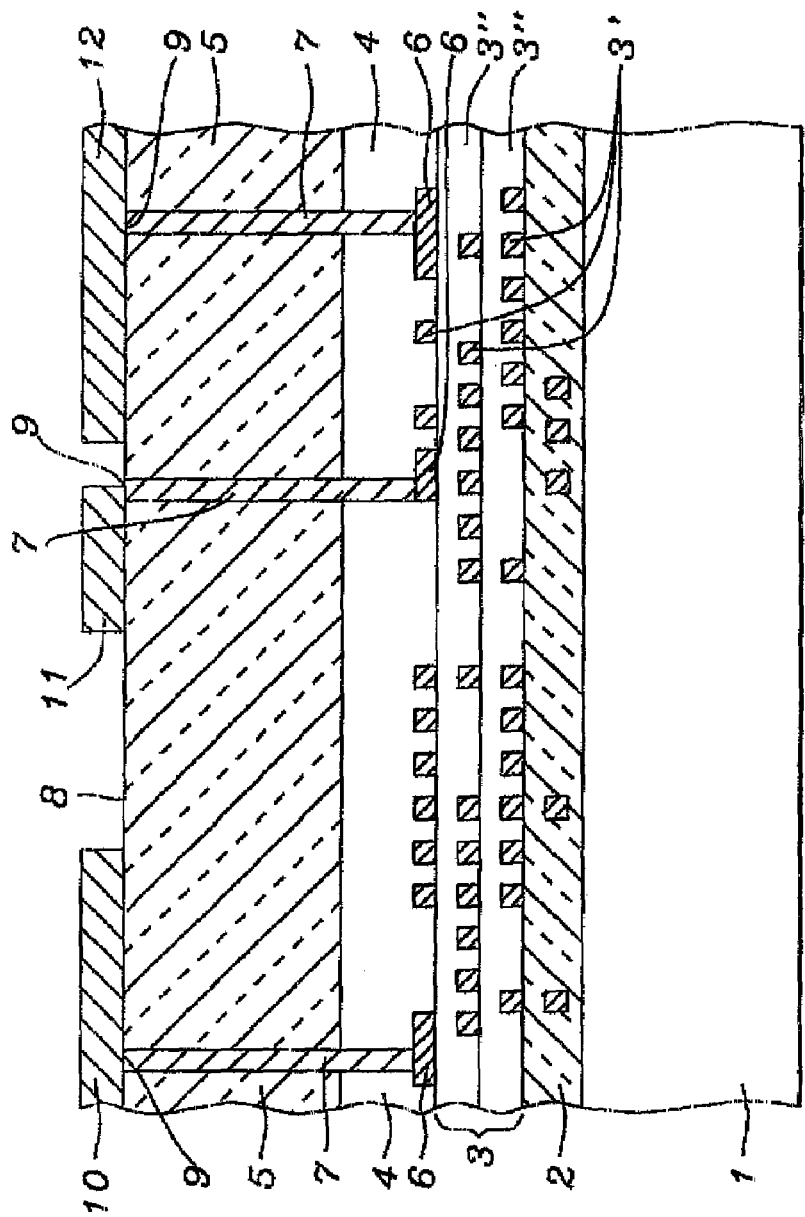
FIG. 1 shows a cross section of the interconnection scheme of the present invention.

Referring now more specifically to FIG. 1, there is shown a cross section of one implementation of the present invention. A silicon substrate 1 has transistors and other devices, typically formed of poly silicon, covered by a dielectric layer 2 deposited over the devices and the substrate. Layer 3 indicates the totality of metal layers 3' and dielectric layers 3" that are typically created on top of the device layer 2. Points of contact 6, such as bonding pads known in the semiconductor art, are in the top surface of layers 3' and are part of layer 3. These points of contact 6 are points within the IC arrangement that need to be Rather connected to surrounding circuitry, that is to power lines or to signal lines. A passivation layer 4, formed of for example silicon nitride, is deposited on top of layer 3, as is known in the art for protecting underlying layers from moisture, contamination, etc.

The key steps of the invention begin with the deposition of a thick layer 5 of polyimide is deposited. A pattern 7 is exposed and etched through the polyimide layer 5 and the passivation layer 4 where the pattern 7 is the same as the pattern of the contact points 6. This opens the contact points 6 up to the surface 8 of the polyimide layer 5.

Electrical contact with the contact points 6 can now be established by filling the openings 7 with a conductor. The tops 9 of this metal conductor can now be used for connection of the IC to its environment, and for further integration into the surrounding electrical circuitry. Pads 10, 11 and 12 are formed on top of the top 9 of the metal conductors 7; these pads can be of any design in width and thickness to accommodate specific circuit design requirements. A larger size pad can, for instance, be used as a flip chip pad. A somewhat smaller in size pad can be used for power distribution or as a ground or signal bus. The following connections can, for instance, be made to the pads shown in FIG. 1: pad 10 can serve as a flip chip pad, pad 11 can serve as a flip chip pad or can be connected to electrical power or to electrical ground or to an electrical signal bus, pad 12 can also serve as a flip chip pad. There is no connection between the size of the pads shown in FIG. 1 and the suggested possible electrical connections for which this pad can be used. Pad size and the standard rules and restrictions of electrical circuit design determine the electrical connections to which a given pad lends itself.

The following comments relate to the size and the number of the contact points 6, FIG. 1. Because these contact points 6 are located on top of a thin dielectric (layer 3", FIG. 1) the pad size cannot be too large since a large pad size brings with it a large capacitance. In addition, a large pad size will inter fete with the routing capability of that layer of metal. It is therefore preferred to keep the size of the pad 6 small. The size of pad 6 is however also directly related with the aspect ratio of via 7. An aspect ratio of about 5 is acceptable for the consideration of via etching and via filling. Based on these considerations, the size of the contact pad 6 can be in the order of 0.3 μm to 5.0 μm, the exact size being dependent on the thickness of layers 4 and 5. The contact points 6 can comprise any appropriate contact material, such as but not limited to tungsten, copper (electroplated or electroless), aluminum, polysilicon, or the like.

The present invention does not impose a limitation on the number of contact pads that can be included in the design; this number is dependent on package design requirements. Layer 4 in FIG. 1 can be a typical IC passivation layer.

The most frequently used passivation layer in the present state of the art is plasma enhanced CVD (PECVD) oxide and nitride. In creating layer 4, a layer of between about 0.15 and 2.0 μm PECVD oxide is deposited first followed by a layer of between about 0.5 and 2.0 μm, and preferably approximately 0.7 μm nitride. Passivation layer 4 is very important because it protects the device wafer from moisture and foreign ion contamination. The positioning of this layer between the sub-micron process (of the integrated circuit) and the tens-micron process (of the interconnecting metallization structure) is of critical importance since it allows for a cheaper process that possibly has less stringent clean room requirements for the process of creating the interconnecting metallization structure.

Layer 5 is a thick polymer dielectric layer (for example polyimide) that has a thickness in excess of 2 μm (after curing) The range of polyimide thickness can vary from 2 μm to 30 μm dependent on electrical design requirements.

For the deposition of layer 5 the Hitachi-Dupont polyimide HD 2732 or 2734 can, for example, be used. The polyimide can be spin-on coated and cured. After spin-on coating, the polyimide will be cured at between approximately 250 and 450 degrees C., preferably at 400 degrees C., for between approximately 0.5 and 1.5 hours, preferably for 1 hour, in a vacuum or nitrogen ambient. For thicker polyimide, the polyimide film can be multiple coated and cured.

Another material that can be used to create layer 5 is the polymer benzocyclobutene (BCB). This polymer is at this time commercially produced by for instance Dow Chemical and has recently gained acceptance to be used instead of typical polyimide application.

The dimensions of opening 7 have previously been discussed. The dimension of the opening together with the dielectric thickness determines the aspect ratio of the opening. The aspect ratio challenges the via etch process and the metal filling capability. This leads to a diameter for opening 7 in the range of approximately 0.5 μm to 3.0 μm while the height for opening 7 can be in the range of approximately 3 μm to 20 μm. The aspect ratio of opening 7 is designed such that filling of the via with metal can be accomplished. The via can be filled with CVD metal such as CVD tungsten or CVD copper, with electro-less nickel, with a damascene metal filling process, with electroplating copper, with sputtering aluminum, etc.

It must be noted that the use of polyimide films as inter-level dielectrics has been pursued as a technique for providing partial planarization of a dielectric surface. Polyimides offer the following characteristics for such applications:

they produce surfaces in which the step heights of underlying features are reduced, and step slopes are gentle and smooth.

they are available to fill small openings without producing the voids that occur when low-temperature CVD oxide films are deposited.

the cured polyimide films can tolerate temperatures of up to 500 degrees C. without degradation of their dielectric film characteristics.

polyimide films have dielectric breakdowns, which are only slightly lower than that of $SiO_2$.

the dielectric constant of polyimides is smaller than that of silicon nitride and of $SiO_2$.

the process used to deposit and pattern polyimide films is relatively simple.

For all of the above characteristics, polyimides are used and recommended within the scope of the present invention.

Figure 2:
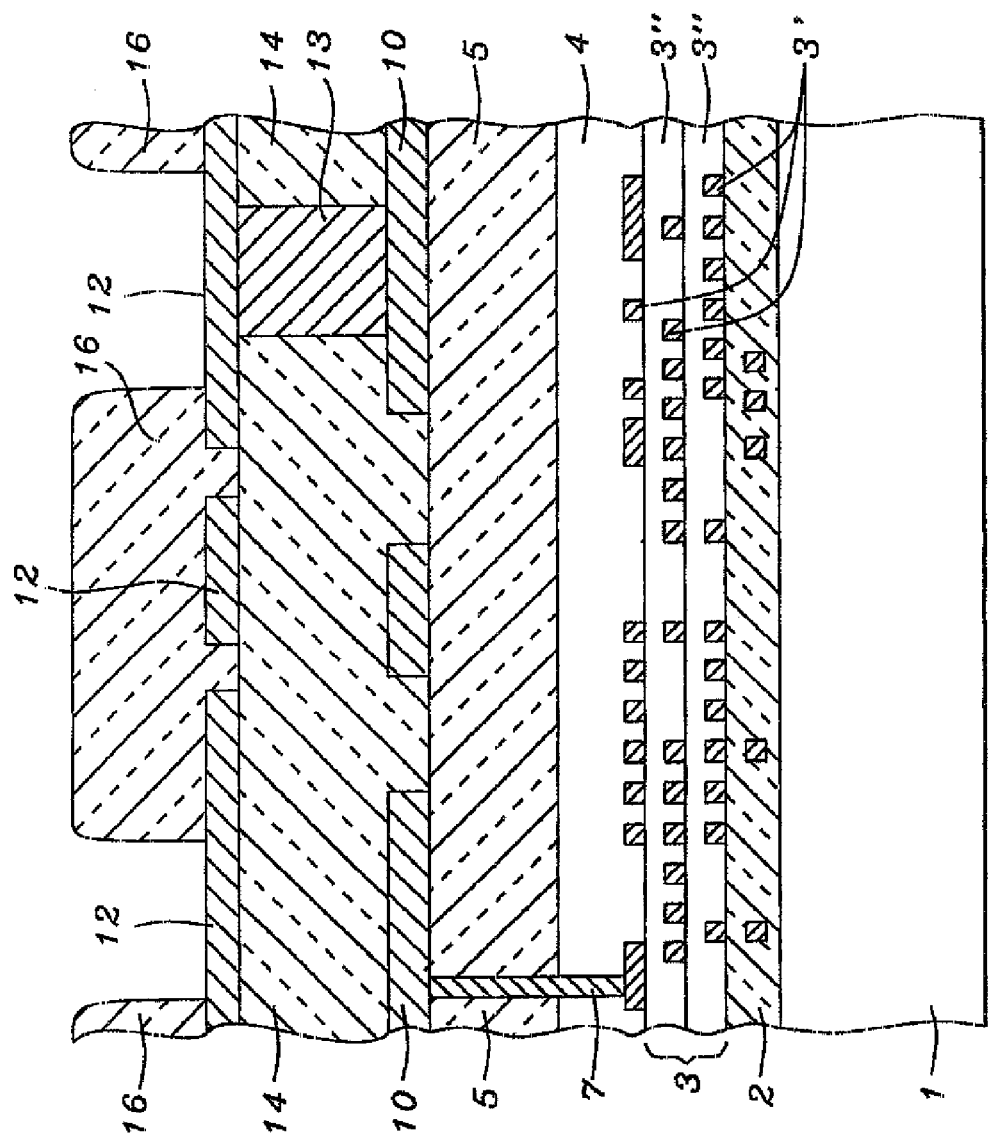
FIG. 2 shows a cross section of the present invention in a more complex circuit configuration.

FIG. 2 shows how the present invention as indicated in FIG. 1 can be further extended to include multiple layers of polyimide and, in so doing, can be adapted to a larger variety of applications. The lower level build up of this cross section is identical to the build up shown in FIG. 1 with a silicon wafer 1, the poly silicon layer 2, the metal and dielectric combined layer 3, the passivation layer 4, the polyimide layer 5 and the pads 10 deposited on top of layer 5. The function of the structure that has been described in FIG. 1 can be further extended by depositing another layer of polyimide 14 on top of the previously deposited layer 5 and overlaying the pads 10. Selective etching and metal deposition can further create contact points 12. These contact points 12 can be connected with pads 10 as shown by connector 13. Depositing pads 12 on top of layer 14 can thus further extend this process. These pads 12 can be further customized to a particular application, the indicated extension of multiple layers of polyimides greatly enhances the flexibility and usefulness of the present invention. Additional alternating layers of polyimide and metal lines and/or power or ground planes may be added above layers 12 and 16, as needed. Dielectric layers 14 and 16 can be formed as described above with reference to FIG. 1 for the dielectric layer 5.

Figure 3A:
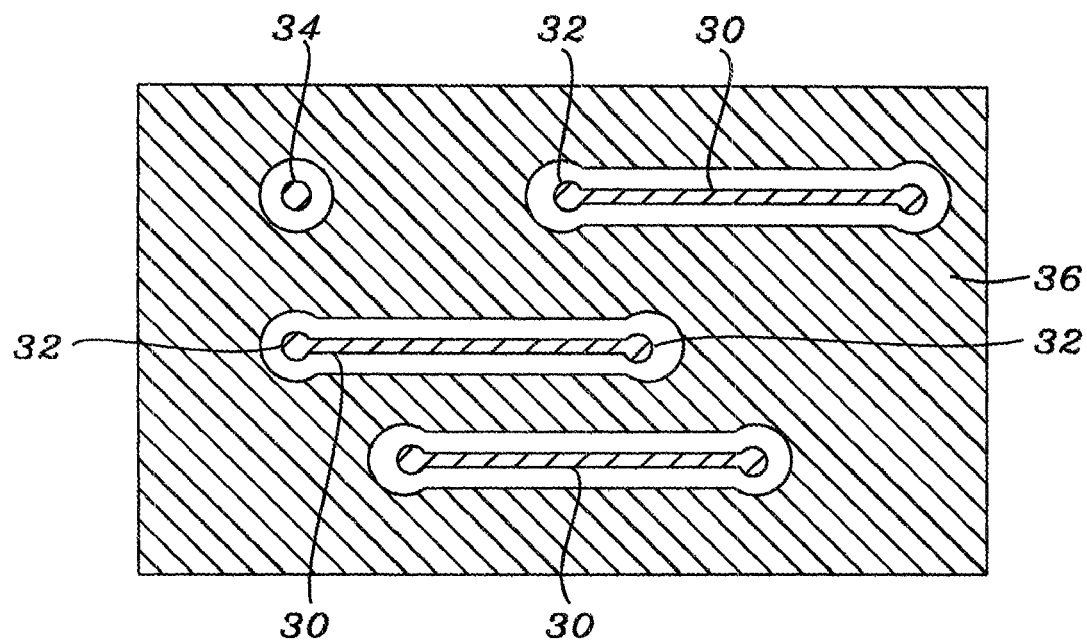
FIG. 3a shows the top view of a combination power and X-signal plane using the present invention.
Figure 3B:
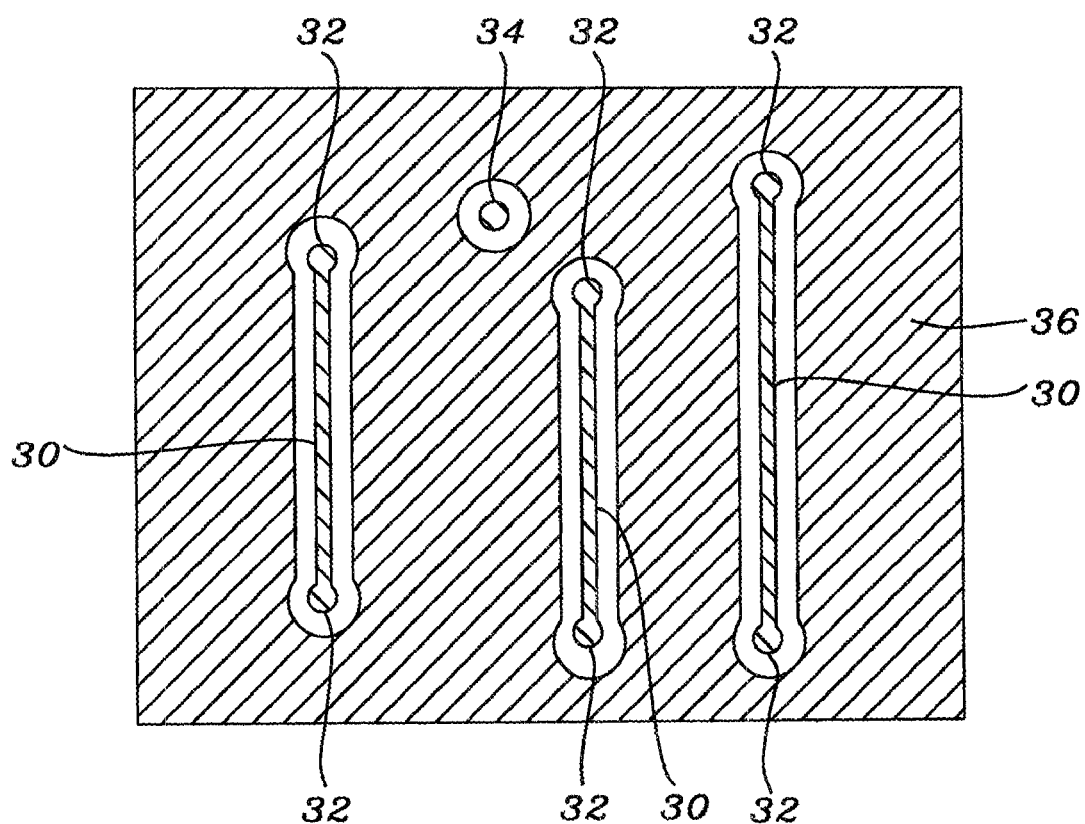
FIG. 3b shows the top view of a combination power and Y-signal plane using the present invention.

FIGS. 3a and 3b show a top view of one possible use of the present invention. Interconnecting a number of pads 32 that have been created as described creates signal lines 30. Additional contact points such as point 34 can allow signal lines to pass vertically between layers. The various contact points can, for instance, be created within the surface of a power plane or ground plane 36. The layers within the interconnecting metallization structure of the present invention can contain signal interconnections in the X-direction, signal interconnections in the Y-direction, signal interconnections between X and or Y directions, interconnections to and/or within power and/or ground buses. The present invention further teaches the interconnection of signal lines, power and ground buses between the connected IC's and the top of the metallization system of the present invention.

FIG. 3a shows signal lines formed in the X-direction. FIG. 3b shows signal lines formed in the Y-direction.

Figure 4:
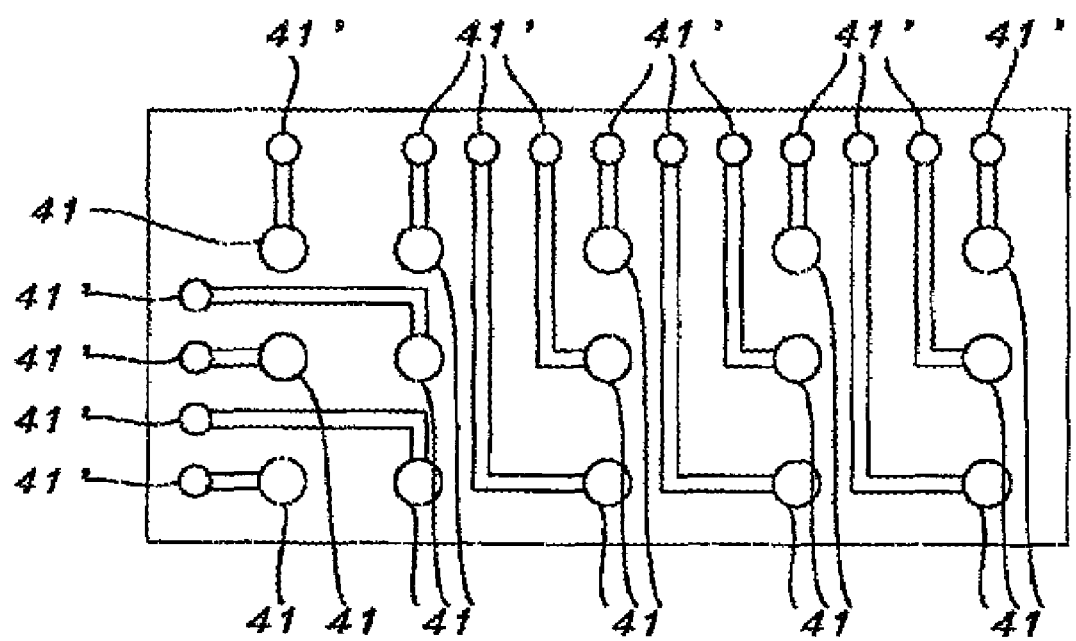
FIG. 4 shows the top view of solder bump arrangement using the present invention and is an expanded view of a portion of FIG. 5.

FIG. 4 presents yet another application of the present invention. Shown in FIG. 4 is an exploded view of a part of FIG. 5 that presents an area array I/O distribution. FIG. 4 shows pads 41 (on which solder bumps can be created) and an example of a layout of the redistribution of the peripheral pads 41'. The exploded view of FIG. 4 is taken along the line 2-2' shown in FIG. 5; the redistribution of the peripheral pads 41' (see FIG. 4) is, for clarity of overview, not shown in FIG. 5. The power or ground connections can be made to any point that is required on the bottom device. Furthermore, the power and ground planes can be connected to the power and ground planes of the package substrates. FIG. 4 shows an example of how to use the topmost metal layer to redistribute the peripheral pads 41' to become area array pads 41. The solder bumps can then be created on pads 41.

Figure 5:
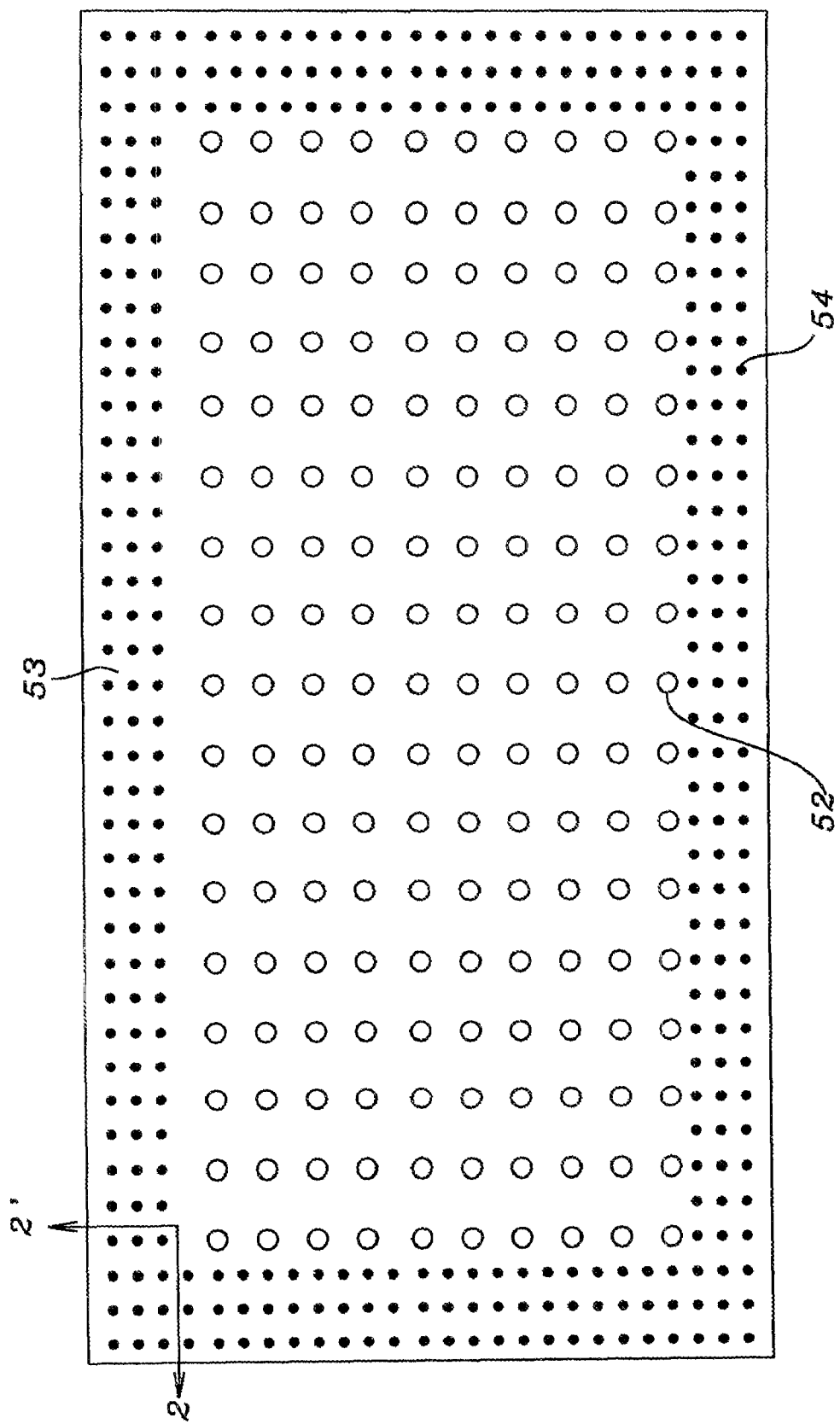
FIG. 5 shows the top view of an example of power/ground pads combined with signal pad using the present invention.

FIG. 5 shows the top surface of a plane that contains a design pattern of a combination of power or ground pads 52 and signal pads 54. FIG. 5 shows the pad openings in the top dielectric layer. It is to be noted that the ground/power pads 52 are heavier and larger in design relative to the signal pads 54. The present invention ideally lends itself to meeting these differences in design, as they are required within the art of chip and high performance circuit design. The number of power or ground pads 52 shown in FIG. 5 can be reduced if there are power and/or ground planes within the chip 53. From this it is clear that the package number of I/O's can be reduced within the scope of the present invention which leads to a reduction of the package cost by eliminating common signal/power/ground connections within the package. For instance, a 470 I/O count on a BGA chip can, within the scope of the present invention, be reduced to a 256 I/O count using the present invention. This results in considerable savings for the overall package.

Figure 6:
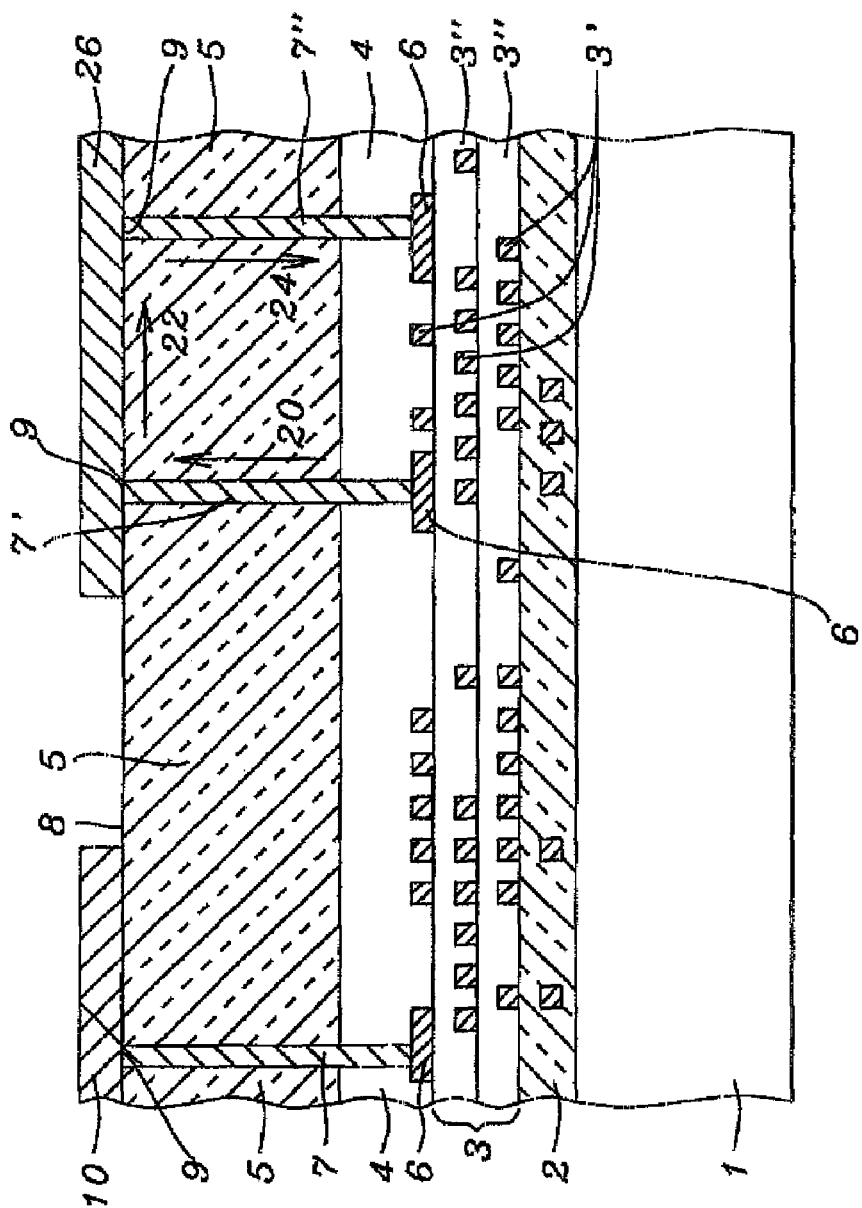
FIG. 6 shows a basic integrated circuit (IC) interconnect scheme of the invention.

FIG. 6 shows a basic design advantage of the invention. This advantage allows for the sub-micron or fine-lines, that run in the immediate vicinity of the metal layers 3' and the contact points 6, to be extended in an upward direction 20 through metal interconnect 7'. This extension continues in the direction 22 in the horizontal plane of the metal interconnect 26 and comes back down in the downward direction 24 through metal interconnect 7". The functions and constructs of the passivation layer 4 and the insulating layer 5 remain as previously highlighted under FIG. 1. This basic design advantage of the invention is to "elevate" or "fan-out" the fine-line interconnects and to remove these interconnects from the micron and sub-micron level to a metal interconnect level that has considerably larger dimensions and is therefore characterized by smaller resistance and capacitance and is easier and more cost effective to manufacture. This aspect of the invention does not include any aspect of conducting line re-distribution and therefore has an inherent quality of simplicity. It therefore further adds to the importance of the invention in that it makes micron and sub-micron wiring accessible at a wide-metal level. The interconnections 7' and 7" interconnect the fine-level metal by going up through the passivation and polymer or polyimide dielectric layers, traverses over a distance on the wide-metal level and continues by descending from the wide-metal level back down to the fine-metal level by again traversing down through the passivation and polymer or polyimide dielectric layers. The extensions that are in this manner accomplished need not to be limited to extending fine-metal interconnect points 6 of any particular type, such as signal or power or ground, with wide metal line 26. The laws of physics and electronics will impose limitations, if any, as to what type of interconnect can by established in this manner where limiting factors will be the conventional limiting factors of resistance, propagation delay, RC constants and others. The upper metallization structure over the passivation layer 4 may comprise any appropriate contact material, such as but not limited to tungsten, chromium, copper (electroplated or electroless), aluminum, polysilicon, or the like. The upper metallization structure over the passivation layer 4 and over the contact points 6 can be formed using a process comprising an electroplating process, a sputtering process, an electroless-plating process, or a damascene process. Where the invention is of importance is that the invention provides much broader latitude in being able to apply these laws and, in so doing, provides a considerably extended scope of the application and use of Integrated Circuits and the adaptation of these circuits to a wide-metal environment. The upper metallization structure may have multiple metal layers and multiple dielectric layers as depicted in FIG. 2. The upper metallization structure may comprise multiple metal traces and a metal plane, such as a power plane or ground plane, enclosing the metal traces as shown in FIGS. 3a and 3b.

Figure 7:
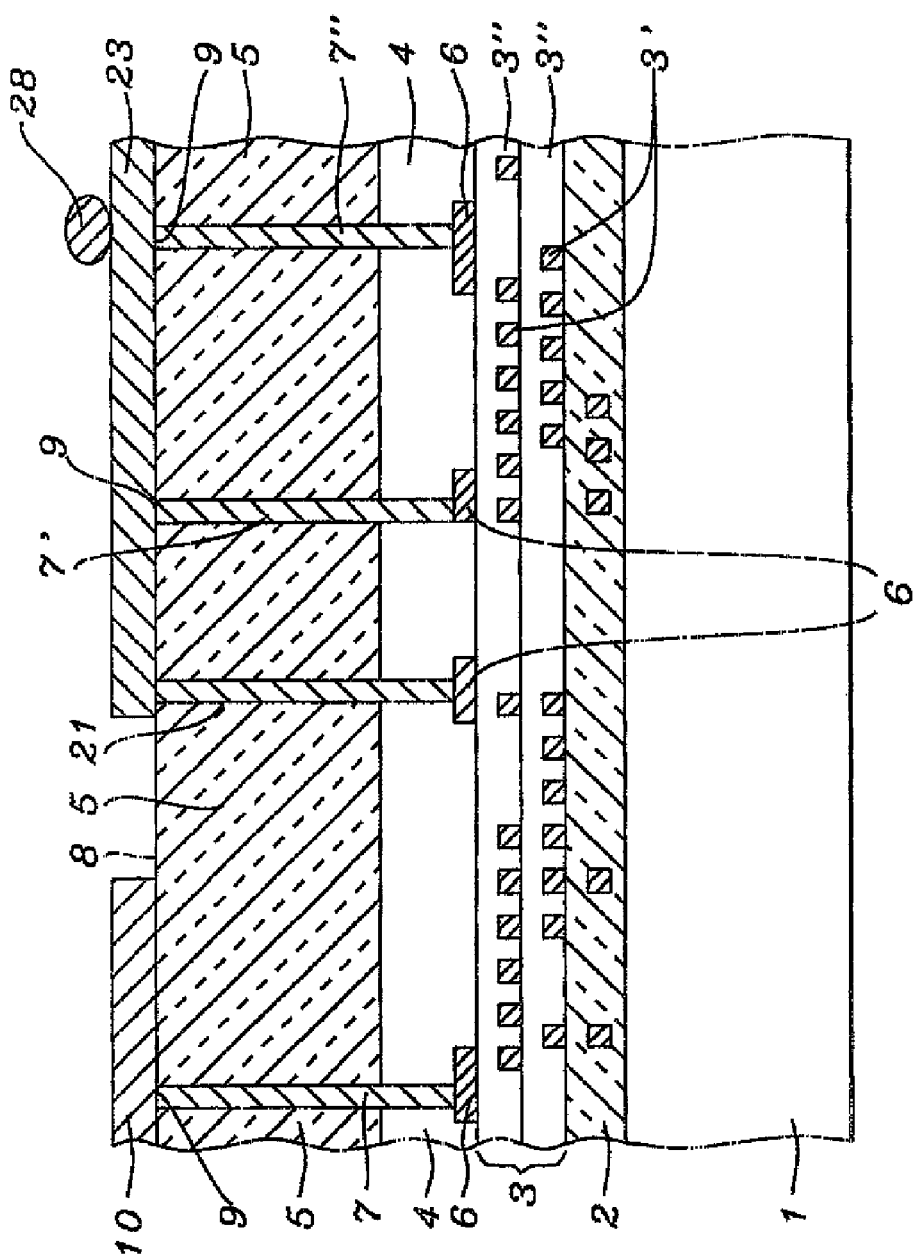
FIG. 7 shows an extension of the basic IC interconnect scheme by adding power, ground and signal distribution capabilities.

FIG. 7 shows how the basic interconnect aspect of the invention can further be extended to now not only elevate the fine-metal to the plane of the wide-metal but to also add power, ground and signal distribution interconnects of power, ground and signal planes at the wide-metal level. The wide-metal interconnect 26 of FIG. 6 is now extended to further include an interconnection with the via 21. In typical IC design, some pads may not be positioned in a location from which easy fan-out can be accomplished to a location that is required for the next step of circuit assembly. In those cases, the BGA substrate requires additional layers in the package construction in order to accomplish the required fan-out. The invention teaches an approach that makes additional layers in the assembling of an IC feasible while not unduly increasing the cost of creating such a multi-layer interface. Ball formation 28 on the surface of interconnect 23 indicates how the invention replaces part of the conventional BGA interconnect function, the solder bump provides for flip chip assembly. This interconnect 28 now connects the BGA device with surrounding circuitry at the wide-metal level as opposed to previous interconnects of the BGA device at the fine-metal level. The wide-metal interconnect of the BGA has obvious advantages of cost of manufacturing and improved BGA device performance. By being able to readily extend the wide-metal dimensions it also becomes possible to interconnect power, ground and signal lines at a wide-metal level thereby reducing the cost and complexity of performing this function at the fine-metal level. The indication of 28 as a ball does not imply that the invention is limited to solder bumps for making interconnects. The invention is equally applicable to wirebonding for making circuit interconnects.

Figure 8:
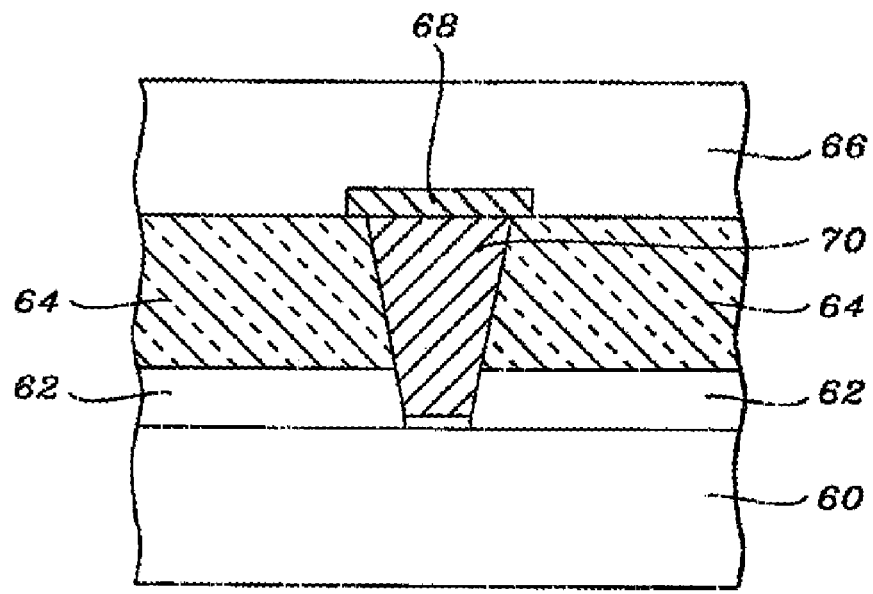
FIG. 8 shows an approach of how to transition from sub-micron metal to wide metal interconnects.

FIG. 8 further shows a cross section wherein the previous linear construction of the metal interconnection running through the passivation layer and the insulation layer is now conical in form. The sub-micron metal layer 60 is covered with a passivation layer 62, a layer 64 of polyimide or polymer is deposited over the passivation layer 62. The wide metal level 66 is formed on the surface of layer 64. The via 70 is shown as having sloping sides, these sloping sides can be achieved by controlling the photolithography process that is used to created the via 70. The etching of the polyimide or polymer can for instance be done under an angle of about 75 degrees with the following curing being done under an angle of 45 degrees. Also, a photosensitive polyimide or polymer can be used, the cone shape of the via 70 can in that case be achieved by variation of exposure combined with time of exposure combined with angle of exposure. Where non-photosensitive polymer or polyimide is used, a wet etch can be applied that has a gradated faster and longer time etch as the top of the via 70 is being approached. The layer of wide-metal pad 68 is deposited on the surface of the polymer or polyimide layer 64, the wide-metal pad deposition 68 mates with the top surface of the via 70 and is centered on top of this surface.

Figure 9:
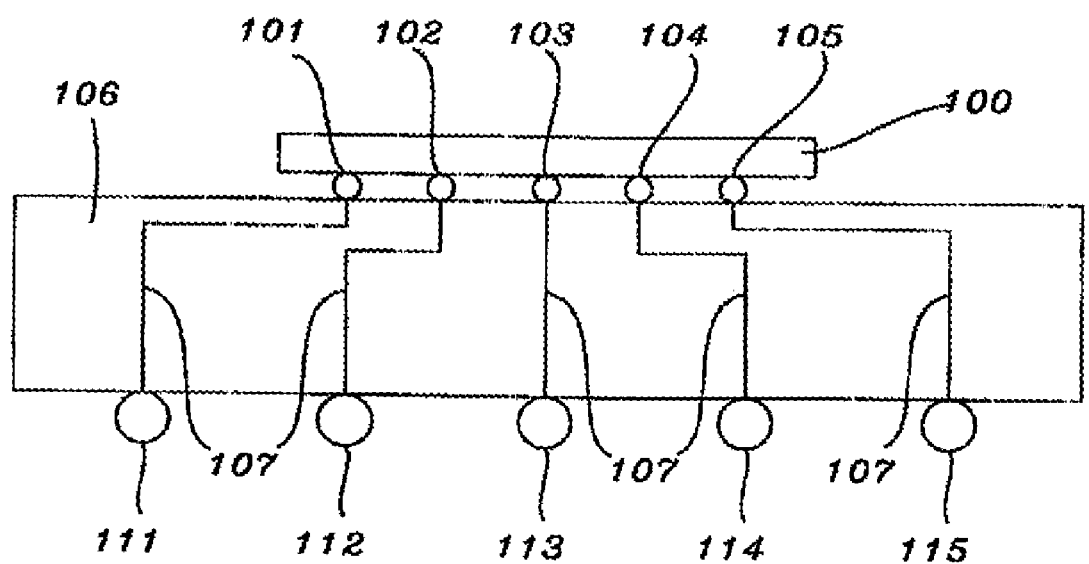
FIG. 9 shows detail regarding BGA device fan out using the invention.
Figure 10:
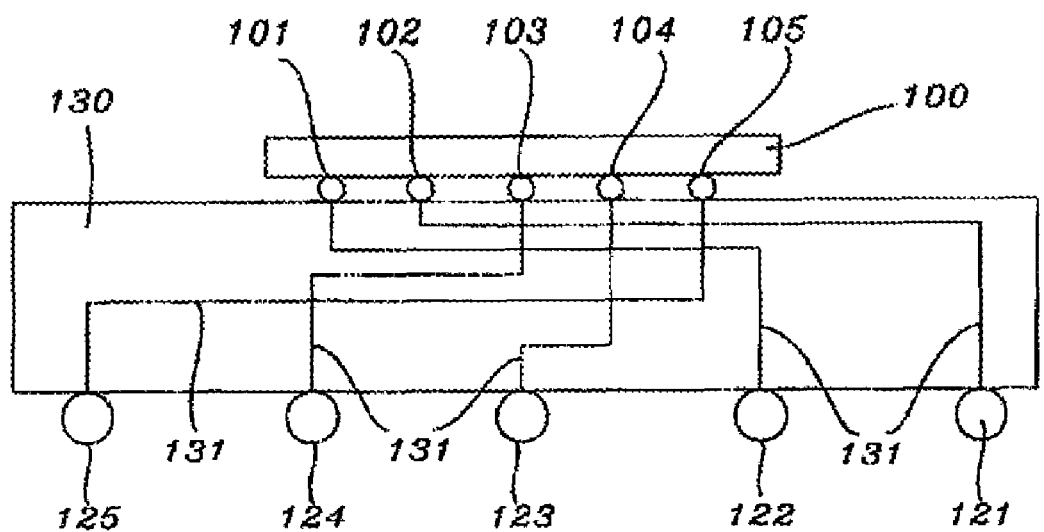
FIG. 10 shows detail regarding BGA device pad relocation using the invention.
Figure 11:
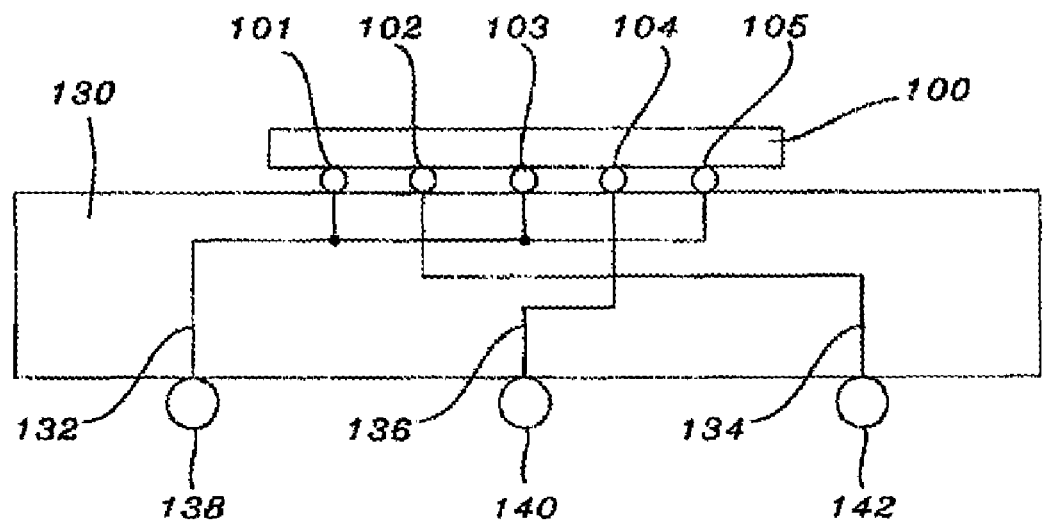
FIG. 11 shows detail regarding the usage of common power, ground and signal pads for BGA devices using the invention.

FIGS. 9 through 11 show further detail to demonstrate the concepts of BGA chip ball fan-out, pad relocation and the creation of common ground, power and signal pads. The concept of pad relocation, fan-out, pad addition or pad reduction can be realized by forming the wide and thick metal interconnection scheme over the passivation layer described in this invention, to replace the function of BGA substrate 130.

FIG. 9 shows a cross section 100 of a BGA chip, five balls 101 through 105 are also shown. By using the BGA substrate 106 and the wiring 107 within the substrate 106, it is clear that ball 101 can be repositioned to location 111, ball 102 to location 112, etc. for the remaining solder bumps 103 through 105. It is clear that the separation of contact points 111 through 115 is considerably larger than the separation of the original solder bumps 101 through 105. The BGA substrate 106 is the subject of the invention, this substrate allows for spreading the distance between the contact points or balls of the BGA device to a considerable degree.

FIG. 10 shows the concept of pad relocation. BGA pad 120 connects to any of the contact balls 101 through 105. By using the BGA substrate 130 and the wiring 131 that is provided within the substrate, it is clear that the BGA pads can be arranged in a different and arbitrary sequence that is required for further circuit design or packaging. For instance contact point 101, which is on the far left side of the BGA device 100, is re-routed to location 122 which is on the second far right of the BGA substrate 130. The re-arrangements of the other BGA solder bumps can readily be learned from following the wiring 131 within the substrate 131 and by tracing from solder bump to one of the contact points 122 through 125 of the BGA substrate.

FIG. 11 shows the interconnecting of BGA device solder bumps into common power, ground or signal pads. The BGA chip 100 is again shown with five solder bumps 101 through 105. The BGA substrate 130 contains a wiring scheme that contains in this example three wiring units, one for each for the power, ground and signal bumps of the BGA device. It is clear from FIG. 11 that wire arrangement 132 connects BGA device solder bumps 101, 103 and 105 to interconnect point 138 of the BGA substrate 130. It can further be seen that BGA device solder bump 104 is connected to interconnect point 140 of the BGA substrate by means of the wire arrangement 136, while BGA device solder bump 102 is connected to interconnect point 142 of the BGA substrate by means of the wire arrangement 134. The number of pins required to interconnect the BGA device 100 is in this manner reduced from five to three. It is clear that for more BGA device solder bumps, as is the case for an actual BGA device, the numeric effect of the indicated wiring arrangement is considerably more beneficial.

The concept of fan-out, pad relocation can be realized by forming the wide and thick metal interconnection scheme over the passivation layer described in this invention, to replace the function of BGA substrate 130. From FIGS. 9, 10 and 11 it can be seen that the extended functionality and extended wiring ability that are provided by the interconnect wiring schemes that are typically created in the BGA substrate 130 can be substituted by forming the wide and thick metal interconnection scheme over the passivation layer, on device 100. Some of the methods and possibilities of interconnect line routing that can be implemented using the method of the invention are highlighted in the following paragraphs.

Fan-out capability can be provided by the invention, using the metal conductors within the openings through the insulating layer and through the passivation layer that connect electrical contact pads of the top metallization structure with contact points of the interconnecting metallization structure. Each of the electrical contact points of the interconnecting metallization structure is connected directly and sequentially with at least one electrical contact point of the top metallization structure. In a fan-out scheme, the distance between electrical contact points of the top metallization structure is larger than the distance between electrical contact points of the interconnecting metallization structure by a measurable amount.

Alternatively, in a pad-addition scheme, the number of electrical contact pads of the upper metallization structure can exceed the number of contact points of the interconnecting metallization structure by a considerable amount. This provides an addition effect.

Pad relocation may also be accomplished by the method of the invention. Electrical contact points of the top metallization structure are connected with the contact points of the interconnecting metallization structure, directly but not necessarily sequentially, thereby creating a pad relocation effect. In this method, the distance between electrical contact points of the top metallization structure is larger than the distance between the electrical contact points of the interconnecting metallization structure by a measurable amount. The positions of the electrical contact points of the top metallization structure over the passivation layer from a top view are different from that of the contact points of the interconnecting metallization structure exposed by the openings in the passivation layer.

A reduction effect may also be accomplished by the method of the invention, wherein common nodes are connected together. Electrical contact points on a top surface of the top metallization structure are connected with contact points of the interconnecting metallization structure exposed by the openings in the passivation layer, where fewer contact points are used in the top metallization structure, since functionally equivalent contact points in the interconnecting metallization structure are connected together. That is, the number of contact points for a particular electrical function among the electrical contact points of the top metallization structure is smaller than the number of electrical contact points of the interconnecting metallization structure exposed by the passivation layer by a measurable amount.

Some of the advantages of the present invention are:

1) improved speed of the IC interconnections due to the use of wider metal lines (which results in lower resistance) and thicker dielectrics between the interconnecting lines (which results in lower capacitance and reduced RC delay). The improved speed of the IC interconnections results in improved performance of High Performance IC's.

2) an inexpensive manufacturing process since there is no need for expensive equipment that is typically used in sub-micron IC fabrication; there is also no need for the extreme clean room facilities that are typically required for sub-micron manufacturing.

3) reduced packaging costs due to the elimination of the need for redundant I/O and multiple power and ground connection points that are needed in a typical IC packaging.

4) IC's of reduced size can be packaged and inter-connected with other circuit or system components without limiting the performance of the IC's.

5) since dependence on ultra-fine wiring is reduced, the use of low resistance conductor wires is facilitated.

6) structures containing more complicated IC's can be created because the invention allows for increased I/O pin count.

7) more complicated IC's can be created without the need for a significant increase in re-distribution of package I/O connections.

8) power buses and clock distribution networks are easier to integrate within the design of IC's.

9) future system-on-chip designs will benefit from the present invention since it allows ready and cost effective interconnection between functional circuits that are positioned at relatively large distances from each other on the chip.

10) form the basis for a computer based routing tool that automatically routes interconnections that exceed a pre-determined length in accordance with the type of interconnection that needs to be established.

11) provide a means to standardize BGA packaging.

12) be applicable to both solder bumps and wirebonding for making further circuit interconnects.

13) provide a means for BGA device solder bump fan-out thereby facilitating the packing and design of BGA devices.

14) provide a means for BGA device pad relocation thereby providing increased flexibility for the packing and design of BGA devices.

15) provide a means for common BGA device power, ground and signal lines thereby reducing the number of pins required to interconnect the BGA device with the surrounding circuits.

16) provide a means for more relaxed design rules in designing circuit vias by the application of sloped vias.

17) provide the means for extending a fine-wire interconnect scheme to a wide-wire interconnect scheme without the need to apply a passivation layer over the surface of the fine-wire structure.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. A semiconductor chip comprising:
a silicon substrate;
multiple transistors on said silicon substrate;
a first metallization structure over said silicon substrate, wherein said first metallization structure comprises a first metal layer over said silicon substrate, a second metal layer over said silicon substrate, a first metal interconnect over said silicon substrate, a second metal interconnect over said silicon substrate, a third metal interconnect over said silicon substrate and between said first and second metal interconnects, and a fourth metal interconnect over said silicon substrate and between said third and second metal interconnects, wherein said first, second, third and fourth metal interconnects are separated from one another by an insulating material, and wherein said first metallization structure comprises electroplated copper;

a dielectric layer between said first and second metal layers;

a passivation layer over said first metallization structure, over said dielectric layer and on said third and fourth metal interconnects, wherein said first, second, third and fourth metal interconnects are provided by a topmost metal layer under said passivation layer, and wherein said passivation layer comprises a topmost nitride layer of said semiconductor chip;

a polymer layer on said passivation layer and over said third and fourth metal interconnects, wherein said polymer layer has a thickness between 2 and 30 micrometers, greater than that of said passivation layer and greater than that of said dielectric layer, and wherein a first opening through said passivation layer and through said polymer layer is over a first contact point of said first metal interconnect and exposes said first contact point, and a second opening through paid passivation layer and through said polymer layer is over a second contact point of said second metal interconnect and exposes said second contact point; and a second metallization structure on said polymer layer, over said passivation layer, over said third and fourth metal interconnects and over said first and second contact points, wherein said third and fourth metal interconnects are directly under said second metallization structure and are not connected to said second metallization structure through any opening through said polymer layer under said second metallization structure, wherein said first contact point is connected to said second contact point through said second metallization structure, wherein said second metallization structure comprises electroplated copper in said first and second openings and over said polymer layer, and wherein said second metallization structure comprises a third metal layer, on said polymer layer, having a thickness greater than that of said first metal layer and greater than that of said second metal layer.

2. The semiconductor chip of claim 1, wherein said polymer layer comprises polyimide.

3. The semiconductor chip of claim 1, wherein said polymer layer comprises benzocyclobutene (BCB).

4. The semiconductor chip of claim 1, wherein said passivation layer further comprises a topmost oxide layer of said semiconductor chip, wherein said topmost nitride layer of said semiconductor chip is over said topmost oxide layer of said semiconductor chip.

5. The semiconductor chip of claim 1, wherein said second metallization structure comprises a signal interconnect connecting said first contact point to said second contact point.

6. The semiconductor chip of claim 1, wherein said second metallization structure comprises a power interconnect connecting said first contact point to said second contact point.

7. The semiconductor chip of claim 1, wherein said second metallization structure comprises a ground interconnect connecting said first contact point to said second contact point.

8. The semiconductor chip of claim 1, wherein said second metallization structure has an entire top surface exposed to an ambience.

9. A semiconductor chip comprising:
a silicon substrate;
multiple transistors on said silicon substrate;
a first metallization structure over said silicon substrate, wherein said first metallization structure comprises a first metal layer over said silicon substrate, a second metal layer over said silicon substrate, a first metal interconnect over said silicon substrate, a second metal interconnect over said silicon substrate, and a third metal interconnect over said silicon substrate and between said first and second metal interconnects, wherein said first, second and third metal interconnects are separated from one another by an insulating material, and wherein said first metallization structure comprises electroplated copper;

a dielectric layer between said first and second metal layers;

a passivation layer over said first metallization structure, over said dielectric layer and on said third metal interconnect, wherein said first, second and third metal interconnects are provided by a topmost metal layer under said passivation layer, and wherein said passivation layer comprises a topmost nitride layer of said semiconductor chip;

a polymer layer on said passivation layer and over said third metal interconnect, wherein said polymer layer has a thickness between 2 and 30 micrometers, greater than that of said passivation layer and greater than that of said dielectric layer, and wherein a first opening through said passivation layer and through said polymer layer is over a first contact point of said first metal interconnect and exposes said first contact point, and a second opening through said passivation layer and through said polymer layer is over a second contact point of said second metal interconnect and exposes said second contact point; and a second metallization structure on said polymer layer, over said passivation layer, over said third metal interconnect and over said first and second contact points, wherein said third metal interconnect is directly under said second metallization structure and is not connected to said second metallization structure through any opening through said polymer layer under said second metallization structure, wherein said first contact point is connected to said second contact point through said second metallization structure, wherein said second metallization structure comprises electroplated copper in said first and second openings and over said polymer layer, and wherein said second metallization structure comprises a third metal layer, on said polymer layer, having a thickness greater than that of said first metal layer and greater than that of said second metal layer.

10. The semiconductor chip of claim 9, wherein said polymer layer comprises polyimide.

11. The semiconductor chip of claim 9, wherein said polymer layer comprises benzocyclobutene (BCB).

12. The semiconductor chip of claim 9, wherein said passivation layer further comprises a topmost oxide layer of said semiconductor chip, wherein said topmost nitride layer of said semiconductor chip is over said topmost oxide layer of said semiconductor chip.

13. The semiconductor chip of claim 9, wherein said second metallization structure comprises a signal interconnect connecting said first contact point to said second contact point.

14. The semiconductor chip of claim 9, wherein said second metallization structure comprises a power interconnect connecting said first contact point to said second contact point.

15. The semiconductor chip of claim 9, wherein said second metallization structure comprises a ground interconnect connecting said first contact point to said second contact point.

16. The semiconductor chip of claim 9, wherein said second metallization structure has an entire top surface exposed to an ambience.

17. A semiconductor chip comprising:

a silicon substrate;

multiple transistors on said silicon substrate;

a first metallization structure over said silicon substrate, wherein said first metallization structure comprises a first metal layer over said silicon substrate, a second metal layer over said silicon substrate, a first metal interconnect over said silicon substrate and a second metal interconnect over said silicon substrate, wherein said first and second metal interconnects are separated from each other by an insulating material, and wherein said first metallization structure comprises electroplated copper;

a dielectric layer between said first and second metal layers;

a passivation layer over said first metallization structure and over said dielectric layer, wherein said first and second metal interconnects are provided by a topmost metal layer under said passivation layer, and wherein said passivation layer comprises a topmost nitride layer of said semiconductor chip;

a polymer layer on said passivation layer, wherein said polymer layer has a thickness between 2 and 30 micrometers, greater than that of said passivation layer and greater than that of said dielectric layer, and wherein a first opening through said passivation layer and through said polymer layer is over a first contact point of said first metal interconnect and exposes said first contact point, and a second opening through said passivation layer and through said polymer layer is over a second contact point of said second metal interconnect and exposes said second contact point; and a second metallization structure on said polymer layer, over said passivation layers and over said first and second contact points, wherein said first contact point is connected to said second contact point though said second metallization structure, wherein said second metallization structure comprises electroplated copper in said first and second openings and over said polymer layer, and wherein said second metallization structure comprises a third metal layer, on said polymer layer, having a thickness greater than that of said first metal layer and greater than that of said second metal layer.

18. The semiconductor chip of claim 17, wherein said polymer layer comprises polyimide.

19. The semiconductor chip of claim 17, wherein said polymer layer comprises benzocyclobutene (BCB).

20. The semiconductor chip of claim 17, wherein said passivation layer further comprises a topmost oxide layer of said semiconductor chip, wherein said topmost nitride layer of said semiconductor chip is over said topmost oxide layer of said semiconductor chip.

21. The semiconductor chip of claim 17, wherein said second metallization structure comprises a power interconnect connecting said first contact point to said second contact point.

22. The semiconductor chip of claim 17 wherein said second metallization structure comprises a ground interconnect connecting said first contact point to said second contact point.

23. The semiconductor chip of claim 17, wherein said second metallization structure comprises a signal interconnect connecting said first contact point to said second contact point.

24. The semiconductor chip of claim 17, wherein said second metallization structure has an entire top surface exposed to an ambience.

* * * * *